(12) United States Patent
Tsai et al.

(10) Patent No.: US 9,689,912 B2
(45) Date of Patent: Jun. 27, 2017

(54) RAPID ANALYSIS OF BUFFER LAYER THICKNESS FOR THIN FILM SOLAR CELLS

(71) Applicant: TSMC Solar Ltd., Taichung (TW)

(72) Inventors: Ming-Tien Tsai, Zhubei (TW); Tzu-Huan Cheng, Kaohsiung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 1237 days.

(21) Appl. No.: 13/708,019

(22) Filed: Dec. 7, 2012

(65) Prior Publication Data
US 2014/0159752 A1 Jun. 12, 2014

(51) Int. Cl.
*G01R 27/08* (2006.01)
*G01R 31/26* (2014.01)
(Continued)

(52) U.S. Cl.
CPC .......... *G01R 31/2605* (2013.01); *H02S 50/10* (2014.12); *H02S 50/00* (2013.01)

(58) Field of Classification Search
CPC ............ G01R 31/2605; G01R 31/2656; G01R 31/405; G01R 31/2603; H01L 31/18; H01L 31/0322; H01L 31/03928; H01L 31/022466; H01L 31/022425; H01L 31/1884; H01L 31/073; H01L 31/0749; H01L 31/046; H01L 31/0236;
(Continued)

(56) References Cited

U.S. PATENT DOCUMENTS 6,310,590 B1 * 10/2001 Havel .................... G01R 13/26
324/115
2009/0032094 A1 * 2/2009 Aoki ................... H01L 31/0322
136/256
(Continued)

FOREIGN PATENT DOCUMENTS

CN 101159225 A 4/2008
CN 201575796 U 9/2010
(Continued)

OTHER PUBLICATIONS

Official Action issued Jan. 28, 2016 in counterpart Chinese Patent Application No. 2016012501531130.
(Continued)

*Primary Examiner* — Thang Le
(74) *Attorney, Agent, or Firm* — Duane Morris LLP

(57) ABSTRACT

A method and apparatus for measuring thickness of a film in a solar cell provides for directing light emitted at multiple emission wavelengths, to a surface of the solar cell. Each emission results in the generation of a responsive photo current. The photo currents are read by a current meter having one contact coupled to a surface of the solar cell and another contact coupled to another surface. The currents associated with each of the different light emissions are identified and the thickness of a film in the solar cell is calculated based on the two currents or associated quantum efficiencies, and associated absorption coefficients. In one embodiment, the film thickness is the thickness of a CdS or other buffer film in a thin film solar cell.

20 Claims, 4 Drawing Sheets

(51) Int. Cl.
*H02S 50/10* (2014.01)
*H02S 50/00* (2014.01)

(58) Field of Classification Search
CPC ..... H01L 22/12; H01L 22/26; G01B 11/0625; G01B 11/0616; G01B 11/0683
USPC ........... 324/761.01, 229, 622, 644, 671, 702
See application file for complete search history.

(56) References Cited

U.S. PATENT DOCUMENTS

| | | | | |
|---|---|---|---|---|
| 2010/0033735 | A1* | 2/2010 | Sakai | G01B 11/0633 356/632 |
| 2011/0259418 | A1* | 10/2011 | Hollars | C23C 14/0057 136/256 |
| 2013/0074925 | A1* | 3/2013 | Hakuma | H01L 31/02242 136/256 |
| 2013/0076367 | A1* | 3/2013 | Allenic | H02S 50/10 324/501 |
| 2013/0095577 | A1* | 4/2013 | Milshtein | G01B 11/0683 438/7 |
| 2014/0093985 | A1* | 4/2014 | Li | H01L 22/12 438/7 |
| 2015/0263213 | A1* | 9/2015 | Britt | C23C 18/12 438/95 |

FOREIGN PATENT DOCUMENTS

| | | |
|---|---|---|
| CN | 102589452 A | 7/2012 |
| CN | 102692191 A | 9/2012 |
| JP | 2003-075126 A | 3/2003 |
| TW | 201132928 A1 | 10/2011 |

OTHER PUBLICATIONS

Office Action dated Oct. 27, 2014, from related Taiwanese Patent Application No. 102142785, 3 pages.

Orgassa, K. et al., "Role of the CdS Buffer Layer as an Active Optical Element in Cu(In,Ga)Se2 Thin-Film Solar Cells", Prog. Photovolt: Res. Appl., 2002, 10:457-463.

Ninomiya S. et al., "Optical Properties of Wurtzite CdS", J. Appl. Phys., 1995, 78:1183-1190.

\* cited by examiner

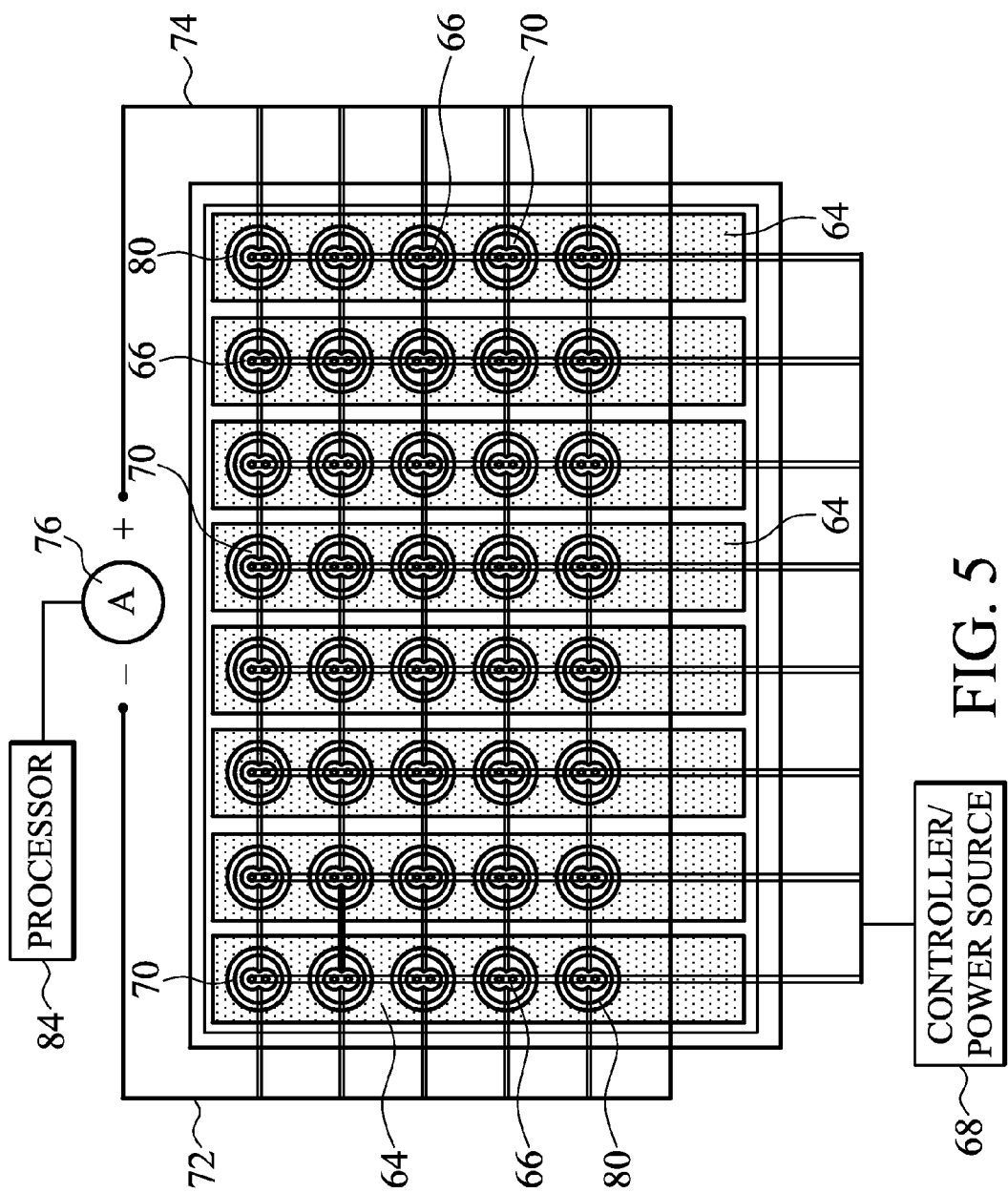

RAPID ANALYSIS OF BUFFER LAYER THICKNESS FOR THIN FILM SOLAR CELLS

TECHNICAL FIELD

The disclosure relates to solar cells and methods and systems for monitoring film thicknesses of solar cells.

BACKGROUND OF THE DISCLOSURE

A buffer layer such as CdS is advantageously utilized to produce a reproducible and efficient heterojunction in thin film solar cells. CdS buffer layers also find application in other types of solar cells. Solar cells are photovoltaic components for direct generation of electrical current from sunlight. Due to the growing demand for clean sources of energy, the manufacture of solar cells has expanded dramatically in recent years. A variety of solar energy collecting modules currently exists. One such module includes a photovoltaic panel that receives solar energy and converts the solar energy directly into electricity. Another such module includes a solar thermal collecting panel which harnesses solar energy for heat. The solar energy collecting modules can have different geometries and be formed of different materials, but generally consist of large, flat solar panels and include an absorber layer.

CdS layers are advantageously utilized as buffer layers in solar cells. CIGS-type solar cells utilize a CdS buffer layer disposed between a ZnO window layer and a CIGS (Cu(In,Ga)Se$_2$) absorber layer. Integrating a CdS layer into the ZnO/CIGS system enhances the spectral absorption of the solar cell, since the refractive index of CdS ($n_r \approx 2.4$) lies between the refractive indices of ZnO ($n_r \approx 1.9$) and CIGS ($n_r \approx 2.9$). The large step between the refractive indices of ZnO and CIGS is therefore divided into two smaller steps resulting in an overall reduced reflectivity of the solar cell. Because of the role that the CdS layer plays, it is important to form the CdS layer to have desired qualities and thicknesses. As a corollary, it is important to analyze and accurately measure or monitor the thickness of the CdS buffer layers. The same is true for other buffer layers in other thin film solar cell embodiments.

Current methods for monitoring the thickness of buffer layers such as CdS, in solar cells include SEM (Scanning Electron Microscope) and TEM (Transmission Electron Microscope) evaluation of thickness. Each of these techniques is destructive, expensive and time consuming. Many other systems that measure EQE (External quantum efficiency) are also expensive and involve time consuming processes and dedicated equipment.

It would be desirable to provide accurate methods and systems for evaluating CdS and other film thicknesses in a non-destructive manner.

BRIEF DESCRIPTION OF THE DRAWING

The present disclosure is best understood from the following detailed description when read in conjunction with the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing.

FIG. 5 is a top view showing an embodiment of a system for measuring film thickness on multiple areas of a module of solar cells, according to the disclosure.

DETAILED DESCRIPTION

Figure 1:
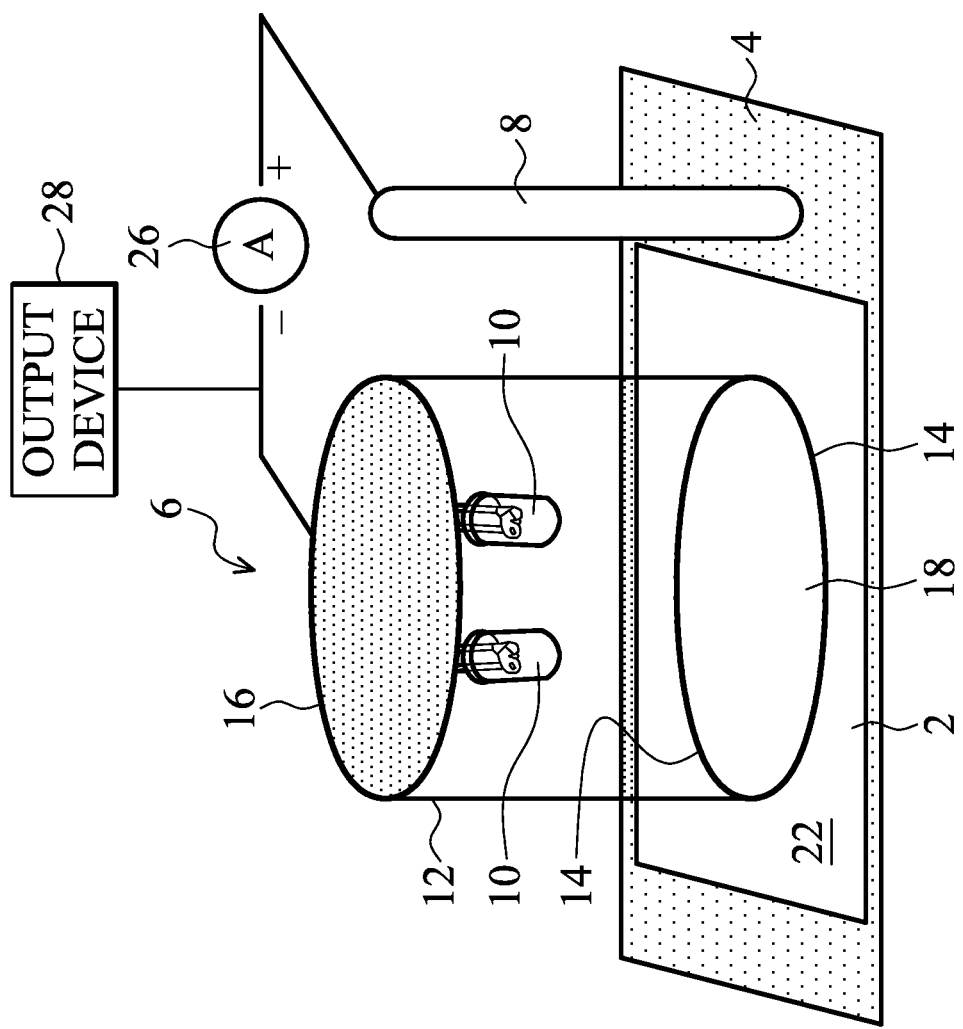
FIG. 1 shows an embodiment of a system for measuring film thickness.

Solar cells which are alternatively referred to as photovoltaic cells or photoelectric cells, are solid state electrical devices that convert light energy directly into electricity by the photovoltaic effect.

A number of solar cells are provided on a substrate that may be referred to as a solar cell substrate, a solar panel, or a solar module. The solar cell substrate is used to capture energy from sunlight. The electrical energy generated from the solar cells is referred to as solar power and is an example of solar energy. Photons in sunlight hit the solar cells and are absorbed by semiconductor materials such as silicon, CIGS (Cu((In,Ga,)Se$_2$)), or other absorber materials. Negatively charged electrons are knocked loose from their atoms by the photons, causing an electric potential difference. Current starts flowing through the solar cell material to cancel the potential difference and this electricity is captured. The electricity produced by a multitude of solar cells on the solar cell substrate is harnessed and coupled to a power cable.

The individual solar cells are semiconductor devices typically formed on glass or other suitable materials. Each solar cell includes at least one absorber layer. Anti-reflection coatings are often applied over the absorber layer of the solar cells in some embodiments. The anti-reflection coatings increase the amount of light coupled into the individual solar cells and absorbed by the absorber layer. CIGS-type solar cells utilize a CdS buffer layer disposed between a ZnO window layer and a CIGS Cu((In,Ga,)Se$_2$) absorber layer. The CdS buffer layer advantageously produces a reproducible and efficient pn junction of ZnO/CdS/Cu(In,Ga,)Se$_2$ in (CIGS) solar cells and increases the efficiency of the solar cell by reducing reflection. CdS buffer layers also find application in other types of solar cells.

The disclosure provides for determining thickness of a buffer layer in the solar cell. The non-destructive technique for determining thickness of the buffer layer includes illuminating the solar cell with multiple emission wavelengths of light, measuring the current generated responsive to each of the emissions and calculating the thickness using various techniques. In one embodiment, the ratios of currents at two different wavelengths is determined and divided by the difference in the absorption coefficients for the two wavelengths, to measure the film thickness. The absorption coefficients, α, is obtained for the buffer layer at various wavelengths in some embodiments and the absorption coefficients are obtained experimentally in other embodiments. The buffer layer is a CdS buffer layer in one embodiment. In other embodiment the thickness is determined for other buffer layers with wavelength dependent absorption coefficients such as ZnS and ZnMgO or other suitable buffer layer materials.

In one embodiment, the buffer layer thickness is given by:

$$t = \frac{\ln(QE_{\lambda 1}/QE_{\lambda 2})}{(a_{\lambda 2} - a_{\lambda 1})} \qquad \text{[Equation 1]}$$

in which t is the film thickness, α is the absorption coefficient and λ1 and λ2 are the two wavelengths of light used. QE is the quantum efficiency at the respective wavelengths of light used. The quantum efficiency, QE, is related to the current generated. The quantum efficiency is the ratio of the number of charge carriers collected by the solar cell to the number of photons of a given energy shining on, i.e. incident upon, the solar cell. (See Equation 2, below.) QE therefore relates to the response of the solar cell to the various emission wavelengths of light that reach the solar cell. Since the number of photons shining on the solar cell for a particular emission wavelength is known or can be calculated, the QE can also be determined by measuring the current.

In some embodiments, a signal representative of the calculated thickness is delivered to a further device such as an output device. In some embodiments, the further device includes a display that displays the current and thickness. In some embodiments, the further device is a controller and in some embodiments, the further device is a controller having a visual display. In some embodiments, the controller communicates with other systems such as but not limited to a buffer layer deposition system. The controller sends a prompt that alerts an engineer or actively adjusts parameters of the buffer layer deposition system in various embodiments. If the original thickness is too thin, in some embodiments, the solar cell can be returned to the buffer layer deposition system for additional deposition. In other embodiments, the controller communicates with other processing tools that can make adjustments to the deposited buffer layer or to subsequent processing operations in view of the calculated buffer layer thickness.

FIG. 1 shows an embodiment of a system for measuring film thickness according to the disclosure. The system includes at least one light source, the light source or sources capable of generating light at multiple emission wavelengths. The system includes at least two contacts. The contacts are used for photo carrier extraction. At least one power source is coupled to the light source or sources to drive the light sources and at least one current meter, i.e., ammeter, is coupled between the two contacts and reads the photo current generated responsive to each of the multiple emissions of light absorbed by the solar cell. The quantum efficiency, QE, is determined from the light incident upon the solar cell and the measured current. A controller is provided to control the signals provided to the light source or sources, in some embodiments, and a processor is provided to carry out the film thickness calculations based on measurements obtained for current or QE, in some embodiments.

FIG. 1 shows solar cell 2 disposed on bottom contact layer 4. Film thickness monitoring system 6 includes two light sources 10 disposed within housing 16 in the embodiment of FIG. 1. Other arrangements are used in other embodiments. In some embodiments, a housing is not used. Housing 16 includes sidewalls 12 that extend down to first contact 14. First contact 14 contacts surface 22 of solar cell 2 and therefore the top of the stack of films that form the solar cell. The solar cell is a CIGS solar cell in some embodiments and other types of solar cells in other embodiments. In various embodiments, the solar cells include absorber layers such as $CuInSe_2$ (CIS), $CuGaSe_2$ (CGS), $Cu(In,Ga)Se_2$ (CIGS), $Cu(In,Ga)(Se,S)_2$ (CIGSS), and CdTe, but still other absorber layers are used in other embodiments. The solar cell includes a CdS layer in some embodiments. In other embodiments the solar cell includes other buffer layers with wavelength dependent absorption coefficients such as ZnS and ZnMgO or other suitable absorber materials. In the illustrated embodiment, sidewalls 12 and housing 16 are shown to be transparent for ease of description and also to illustrate light sources 10. In other embodiments, sidewalls 12 and housing 16 are opaque and include a bottom opening bounded by first contact 14. When first contact 14 and housing 16 are placed on surface 22 of solar cell 2, portion 18 of solar cell 2 is exposed in the opening bounded by first contact 14. According to the embodiment in which sidewalls 12 and housing 16 are opaque, the light is focused on portion 18 of solar cell 2 exposed in the bottom opening of housing 16. According to this embodiment, the emitted light is confined within the opaque housing 16, optical background noise is reduced and the signal to noise (S/N) ratio is increased, more efficiently delivering light from light sources 10 to portion 18 of solar cell 2. In one embodiment, housing 16 is formed of a conductive material such as conductive rubber and in other embodiments, housing 16 is formed of other suitable materials such as metals, copper nanotubes or other suitable conductive materials. The conductive rubber may contain suspended carbon or silver spheres in some embodiments.

Second contact 8 directly contacts bottom contact layer 4 in the illustrated embodiment and forms the back contact, i.e. second contact 8 contacts the bottom of the stack of films that form solar cell 2. In some embodiments, bottom contact layer 4 is formed of molybdenum. Current meter 26 is coupled between first contact 14 and second contact 8. It is also possible to couple current meter 26 to first contact 14 using various electrical connections (not shown) in the embodiment in which housing 16 is not formed of a conductive material.

Light sources 10 emit photons that strike at least portion 18 of surface 22 of solar cell 2. In one embodiment, light sources 10 are LEDs but other light sources such as lasers or other suitable light sources are used in other embodiments. According to one embodiment, one light source 10 is powered to emit light at a first emission wavelength and the other light source 10 is powered to emit light at a second emission wavelength. Various emission wavelengths are used. A power source (not illustrated) is coupled to each light source 10 in one embodiment and in another embodiment, one power source is coupled to both light sources 10. Various power sources are available and are used in various embodiments.

According to various embodiments, the sole light source or each of multiple light sources 10, emits light having multiple emission wavelengths, and at least two emission wavelengths in all embodiments. In the illustrated embodiment, housing 16 is substantially cylindrical and first contact 14 is annular, but other configurations are used in other embodiments. Various designs in which housing 16 is symmetric along at least one dimension, are used in various other embodiments. When the photons strike portion 18 of surface 22 of solar cell 2, current is generated as described above and the current is delivered from first contact 14 to second contact 8 or vice versa. The closed loop created by the coupling of first contact 14 and second contact 8 through current meter 26 is used to measure current. In one embodiment, light sources 10 are powered at different times and one light source 10 emits light at a first emission wavelength generating a current measured by current meter 26. The other light source 10 is powered to emit light at a different emission wavelength generating a current that is also measured by current meter 26. In one embodiment, the two light sources are powered sequentially and in one embodiment, power is supplied to the two light sources that generate different emission wavelengths of light, in an alternating manner. In another embodiment, the two light sources 10 are powered at the same time to emit light with at least two emission wavelengths. The two signals powering the light source and the two current signals associated with current generated by each of the respective emissions, can be decoupled in frequency domain and transformed into time domain to isolate the different currents associated with each of the associated different emission wavelengths.

In one embodiment, the two wavelengths are 450 and 520 nm, but other wavelengths are used in other embodiments. In some embodiments, each emission includes a range of wavelengths of light. According to the aforementioned embodiment in which the two wavelengths are 450 and 520 nm, the first emission may include a range of wavelengths of light including the wavelength of 450 nm, and the second emission of light may include a range of wavelengths of light including 520 nm. In some embodiments, the two wavelengths lie in the range of 250 to 600 nm, but other wavelengths are used in other embodiments. In some embodiments, current meter 26 includes a readout that displays the measured currents.

The thickness, t, of the buffer layer is then determined using any of the aforedescribed techniques. Absorption coefficients for buffer layers such as CdS at various wavelengths are available or they can be determined experimentally. According to the embodiment in which equation 1 is used, the QE is also determined as a function of current for CdS for various emission wavelengths. A solar cell's quantum efficiency value, QE, indicates the amount of current that the cell will produce when irradiated by photons of a particular wavelength, and can be expressed as follows.

$$QE = \frac{\frac{electrons}{sec}}{\frac{photons}{sec}} = \frac{\frac{current}{(charge\ of\ 1\ electron)}}{\frac{(total\ power\ of\ photons)}{(energy\ of\ one\ photon)}} \quad \text{[Equation 2]}$$

In one embodiment, the quantum efficiency, QE, is determined based on the current delivered, the amount of photons, i.e. light, delivered to the surface of the solar cell and intrinsic properties of the buffer material. In other embodiments, other techniques for determining thickness t are used.

In some embodiments, current meter 26 is coupled to a further device such as output device 28. In some embodiments, output device 28 includes a display that displays measured thickness, t. In some embodiments, output device 28 reads, analyzes and stores the values of the measured currents and the thicknesses. In some embodiments, output device 28 is a controller that communicates with other production tools such as a deposition system used to form the buffer layer. In other embodiments, output device 28 communicates with other tools in the solar cell fabrication process which can compensate for thickness, t, when the measured thickness is not as desired.

Figure 2:
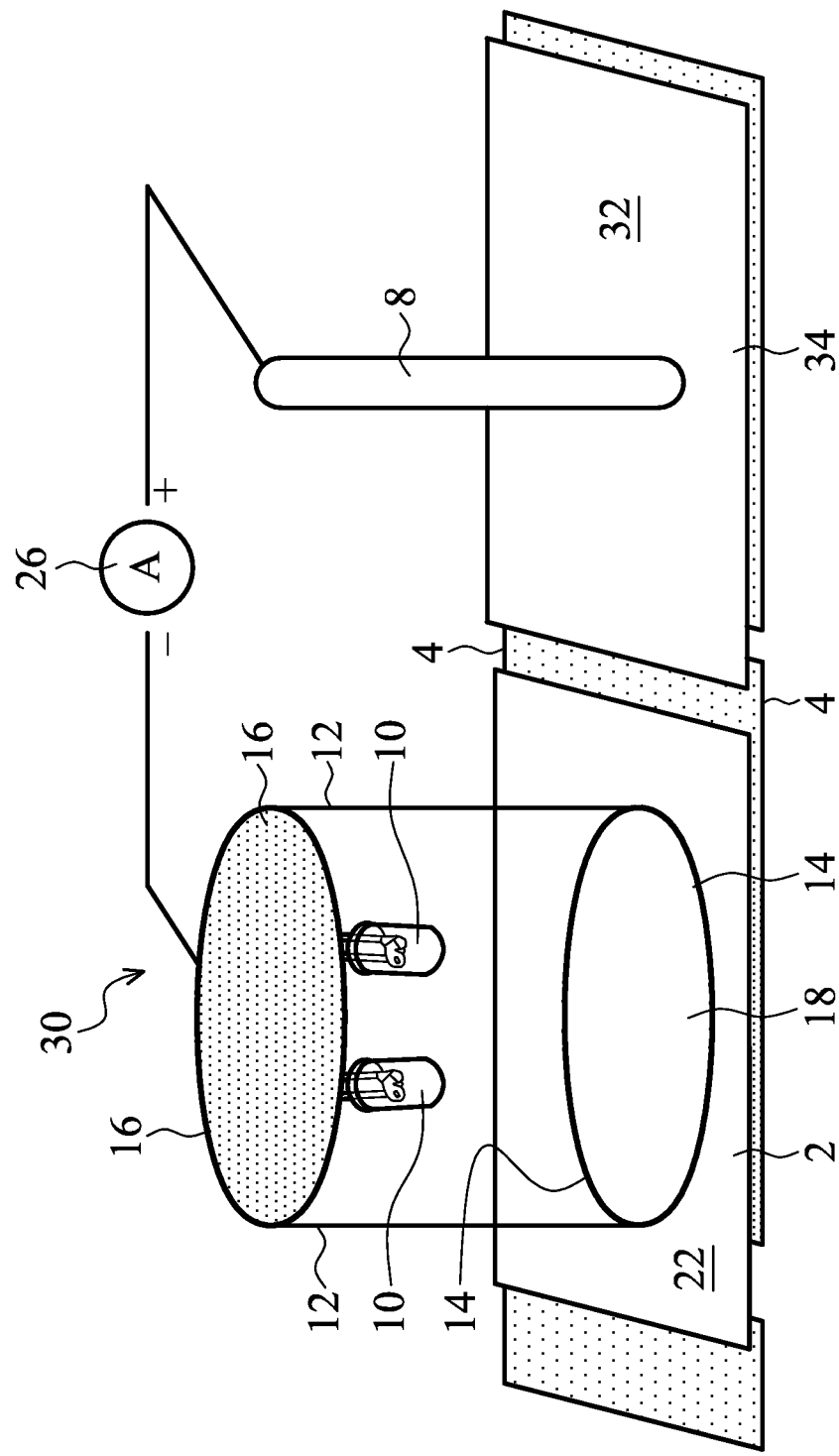
FIG. 2 shows another embodiment of a system for measuring film thickness.

FIG. 2 shows another embodiment of a film thickness monitoring system. Film thickness monitoring system 30 is substantially the same as film thickness monitoring system 6 shown in FIG. 1, with the noted exception that second contact 8 is in contact with surface 32 of adjacent solar cell 34. According to the embodiment illustrated in FIG. 2, the connection between surface 32 and bottom contact layer 4 serves as an interconnect between adjacent solar cells 2 and 34, thereby enabling a closed loop for current to flow between first contact 14 and second contact 8.

Figure 4:
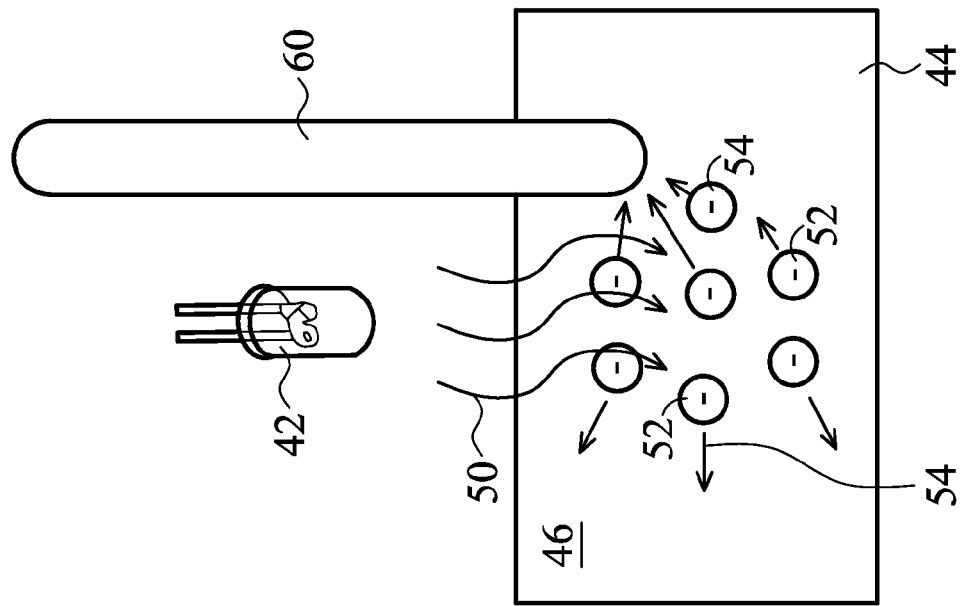
FIG. 4 shows another embodiment of a film thickness monitoring system according to the disclosure.
Figure 3:
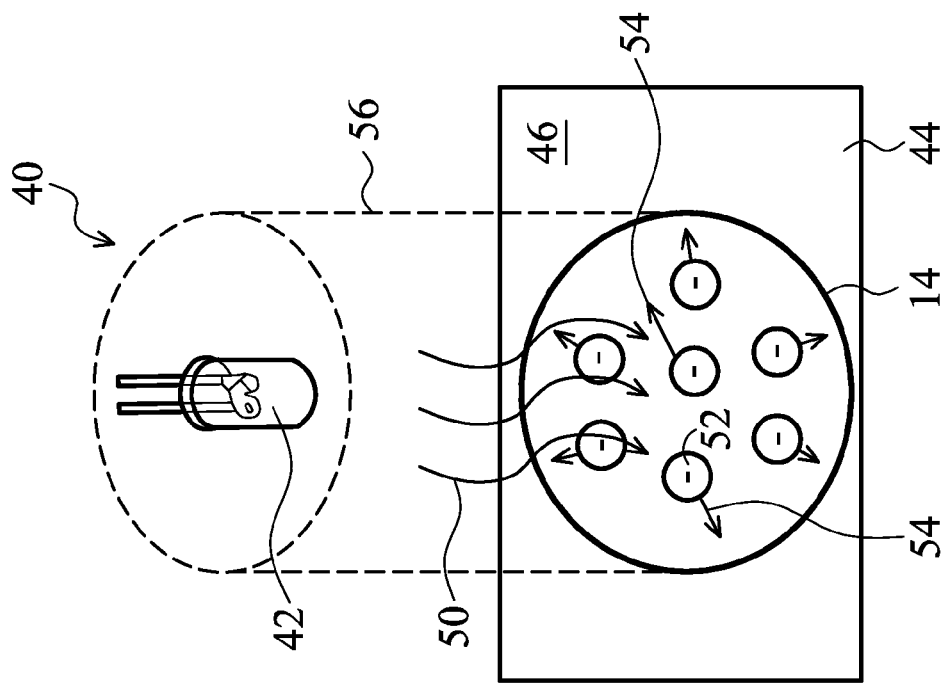
FIG. 3 shows yet another embodiment of a system for measuring film thickness.

FIG. 3 shows another embodiment of a film thickness monitoring system. FIGS. 3 and 4 show portions of a film thickness monitoring system, other portions of which were shown in FIGS. 1 and 2. Film thickness monitoring system 40 includes a single light source 42. Housing 56 is shown in dashed lines as it is used in some embodiments. In other embodiments, light source 42 is maintained in position with respect to surface 46 of solar cell 44, using other mechanical means. According to this embodiment in which one light source 42 is used, light source 42 is capable of emitting light at multiple emission wavelengths. FIG. 3 also illustrates another aspect according to the disclosure. Emitted light 50 is directed to surface 46. Multiple emission wavelengths of emitted light 50 are generated by light source 42 according to this embodiment. When emitted light 50 strikes surface 46, photo carriers 52 generate carrier drift along direction 54, the carrier drift detected by annular first contact 14. Other aspects of the film thickness measurement system are shown in FIGS. 1 and 2, for example.

A power generator (not shown) is used in conjunction with a switch or filter to direct signals to light source 42 to emit light at multiple emission wavelengths. The emission includes the sequential emission of light at different wavelengths, in some embodiments. In one embodiment, multiple signals with different frequencies are delivered to light source 42, each causing the emission of light at an associated and different wavelength. In one embodiment, the emitted light with multiple emission wavelengths is produced responsive to a signal of modulated frequency delivered to light source 42 using the switch or filter. The resulting currents detected by a current meter such as shown in FIG. 1 or 2 may be decoupled in the time domain to associate each of the measured currents as associated with a respective one of the emission wavelengths and therefore an associated one of the input signals.

In another embodiment, a function generator delivers two signals to the light source 42. Each signal corresponds to an emission wavelength of light produced by light source 42 and delivered as light 50 to solar cell 44, and each signal results in the generation of an associated current read by a current meter, such as current meter 26 of FIGS. 1 and 2.

FIG. 4 shows portions of another film thickness monitoring system according to the disclosure. Single light source 42 emits light 50 which is directed to surface 46 of solar cell 44. Absorbed photons cause the production of carriers 52 which drift or diffuse along direction 54 and are detected by contact 60 according to another embodiment. In other embodiments, contact 60 takes on other shapes and includes a greater area of contact with surface 46 of solar cell 44.

FIG. 5 shows solar cell module 64 that includes a number of individual solar cells. FIG. 5 illustrates how the film thickness monitoring system of the disclosure is used to monitor thickness of multiple solar cells in a solar cell module. In the embodiment of FIG. 5, each cell 70 includes two light sources 66 coupled to a power source/controller and includes two contacts through which current meter 76 can read currents.

Power is applied to light sources 66 by controller/power source 68. Controller/power source 68 includes switches in various embodiments and is capable of directing multiple signals to light sources 66 or a single signal with modulated frequency that causes one or both of light sources 66 to emit at multiple emission wavelengths. Light sources 66 are powered at the same time or different times and may be powered in an alternating manner according to various embodiments such as described previously. Light sources 66 are LEDs, lasers or other suitable light sources. Although two light sources 66 are shown for each cell 70 in the illustrated embodiment, it should be understood that in other embodiments, only one light source is used and in still other embodiments, more than two light sources 66 are utilized. For each cell 70, opposed contacts are disposed to enable current flow through conductive wires 72 and 74 and through current meter 76. In one embodiment, one of the contacts is annular first contact 80 that contacts the surface of solar cell module 64 with the second contact coupled to a backside film of the solar cell or the surface of an adjacent or other solar cell not being presently powered.

Each cell 70 is associated with a portion of solar cell module 64 and in some embodiments, each portion represents a different, i.e. separately manufactured, solar cell. In other embodiments, each cell 70 is associated with a different portion of an integral solar cell module 64. In either embodiment, the modular arrangement illustrated in FIG. 5 is advantageously used to monitor buffer layer film thickness at various locations and therefore determine the uniformity of the buffer layer film at various spatial locations. Processor 84 is adapted to decouple the different current signals associated with the currents generated responsive to the different emission wavelengths of light directed to solar cell module 64. According to one embodiment, the film thickness at various locations on solar cell module 64 is mapped. Each thickness may be determined automatically such as by a processor, or using other techniques. In one embodiment, Equation 1 is used to calculate thickness. In some embodiments, processor 84 carries out the calculations described above.

According to one aspect, a method for measuring thickness of a solar cell film is provided. The method comprises providing a solar cell that includes a buffer layer with a wavelength dependent absorption coefficient; generating light having a plurality of emission wavelengths; exposing the solar cell to at least two wavelengths of light; measuring photovoltaic currents generated in the solar cell responsive to the exposing, for each of the wavelengths of light; and mathematically calculating thickness of the buffer layer using the measured photovoltaic currents and absorption coefficients associated with each of the wavelengths of light.

According to another aspect, a method for measuring thickness at multiple locations on a solar cell module, is provided. The method comprises: providing the solar cell module including a plurality of solar cells, each including a buffer layer; for each the solar cell, determining buffer layer thickness by: providing a plurality of light sources and exposing the solar cell to a first emission wavelength of light from a first light source of the plurality of light sources and to a second emission wavelength of light from a second light source of the plurality of the light sources; measuring photovoltaic currents generated in the solar cell responsive to the exposing to the first emission wavelength of light and responsive to the exposing to the second emission wavelength of light; providing absorption coefficients associated with each of the wavelengths of light; and mathematically calculating the buffer layer thickness using the measured photovoltaic currents and associated absorption coefficients.

According to another aspect, a system for measuring thickness of a solar cell film, is provided. The system comprises: at least one light source capable of directing light to a surface of a solar cell that includes a buffer layer, the at least one light source capable of emitting light with multiple emission wavelengths; a first contact contacting the surface; a second contact contacting a conductive surface of a layer of the solar cell, disposed below the surface; a current meter coupled between the first and second contacts and capable of reading a first current between the first and second contacts generated by a first emission wavelength of light and a second current between the first and second contacts generated by a second emission wavelength of light; and a processor capable of calculating thickness of the buffer layer based on the first and second currents and absorption coefficients corresponding to each of the first and second emission wavelengths The preceding merely illustrates the principles of the disclosure. It will thus be appreciated that those of ordinary skill in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid the reader in understanding the principles of the disclosure and the concepts contributed by the inventors to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the disclosure has been described in terms of exemplary embodiments, it is not limited thereto. Rather, the appended claims should be construed broadly, to include other variants and embodiments of the disclosure, which may be made by those of ordinary skill in the art without departing from the scope and range of equivalents of the disclosure.

What is claimed is:

1. A method for measuring thickness of a solar cell film, said method comprising:
   providing a solar cell that includes a buffer layer with a wavelength dependent absorption coefficient;
   generating light having a plurality of emission wavelengths;
   exposing said solar cell to at least two wavelengths of said light;
   measuring photovoltaic currents generated in said solar cell responsive to said exposing to each of said at least two wavelengths of said light;

calculating a thickness of said buffer layer based on said measured photovoltaic currents and absorption coefficients associated with each of said at least two wavelengths of said light; and delivering an output signal of said calculated thickness to an output device.

2. The method as in claim 1, wherein said buffer layer comprises CdS (cadmium sulfide).

3. The method as in claim 1, wherein said calculating includes using a ratio of said measured photovoltaic currents and dividing said ratio by a difference in said absorption coefficients associated with each of said at least two wavelengths of said light, to obtain said thickness.

4. The method as in claim 1, wherein said output device comprises a controller that displays said calculated thickness and communicates with a buffer layer deposition system.

5. The method as in claim 1, wherein said generating light comprises using a plurality of light sources each with an associated emission wavelength and wherein said exposing said solar cell to said at least two wavelengths of said light includes exposing said solar cell to at least two of said plurality of said light sources.

6. The method as in claim 5, wherein said exposing said solar cell to said at least two wavelengths of said light includes sequentially exposing said solar cell to said at least two of said plurality of said light sources.

7. The method as in claim 1, wherein said generating light comprises using one light source capable of emitting light at multiple emission wavelengths and wherein said exposing includes directing signals to said one light source to sequentially emit light at each of said at least two wavelengths of said light.

8. The method as in claim 7, wherein a first signal of said signals causes said one light source to emit a first range of wavelengths of said light including a first wavelength of said light, and a second signal of said signals causes said one light source to emit a second range of wavelengths of said light including a second wavelength of said light, and further comprising decoupling said first and second signals by one of time and frequency.

9. The method as in claim 1, wherein said providing said solar cell includes said buffer layer disposed between an upper conductive layer and a subjacent absorber layer, and said absorber layer comprises one of CuInSe2 (CIS), CuGaSe2 (CGS), Cu(In,Ga)Se2 (CIGS), Cu(In,Ga)(Se,S)2 (CIGSS), and CdTe.

10. The method as in claim 1, wherein said measuring photovoltaic currents includes providing an ammeter, disposing an electrode of said ammeter contacting a top surface of said solar cell and a further electrode of said ammeter contacting a bottom layer of said solar cell, and wherein a first wavelength of said at least two wavelengths of said light lies in a range of about 250-500 nm and a second wavelength of said at least two wavelengths of said light lies in a range of about 350-600 nm.

11. A method for measuring thickness at multiple locations on a solar cell module, said method comprising:

providing said solar cell module including a plurality of solar cells, each including a buffer layer;

for each said solar cell, determining a thickness of said buffer layer by:

providing a plurality of light sources and exposing said solar cell to a first emission wavelength of light from a first light source of said plurality of light sources and to a second emission wavelength of light from a second light source of said plurality of said light sources;

measuring photovoltaic currents generated in said solar cell responsive to said exposing to said first emission wavelength of said light and responsive to said exposing to said second emission wavelength of said light; and mathematically calculating said buffer layer thickness based on said measured photovoltaic currents and absorption coefficients associated with each of said first and second emission wavelengths of said light.

12. The method as in claim 11, wherein said buffer layer comprises CdS (cadmium sulfide), said providing a plurality of light sources includes providing two light sources in an opaque housing and said measuring photovoltaic currents includes using an annular shaped first contact bounding an opening of said housing and contacting said solar cell, and further comprising mapping thickness of said solar cell module based on said respective CdS layer thicknesses.

13. An apparatus for measuring thickness of a solar cell film, said system comprising:

at least one light source capable of directing light to a top surface of a solar cell that includes a buffer layer, said at least one light source capable of emitting light with multiple emission wavelengths;

a first contact contacting said top surface;

a second contact contacting a conductive surface of a layer of said solar cell, disposed below said top surface;

a current meter coupled between said first and second contacts and capable of reading a first current between said first and second contacts generated by a first emission wavelength of said light and a second current between said first and second contacts generated by a second emission wavelength of said light; and a processor capable of calculating thickness of said buffer layer based on said first and second currents and absorption coefficients corresponding to each of said first and second emission wavelengths.

14. The apparatus as in claim 13, wherein said at least one light source comprises two light sources, including a first light source comprising a first LED or laser emitting said first emission wavelength of light and a second light source comprising a second LED or laser emitting said second emission wavelength of light.

15. The apparatus as in claim 13, further comprising a housing including said at least one light source therein, said housing being opaque and including an opening bounded by said first contact.

16. The apparatus as in claim 15, wherein said housing is generally symmetric along at least one dimension and said first contact is generally annular.

17. The apparatus as in claim 15, wherein said housing is formed of a material selected from a group consisting of conductive rubber, metal, copper nanotubes, and further conductive materials.

18. The apparatus as in claim 13, wherein said at least one light source comprises one LED capable of emitting light with said multiple emission wavelengths, and a power source coupled thereto.

19. The apparatus as in claim 18, wherein said power source directs at least two signals to said one LED or laser, said at least two signals including a first signal that directs said one LED or laser to emit light at said first emission wavelength of said light, and a second signal that directs said one LED or laser to emit light at a second emission wavelength of said light; and wherein the processor decouples said first and second signals.

20. The apparatus as in claim 19, wherein said one LED or laser emits light at said first and second emission wavelengths of light substantially simultaneously, said power source directs said at least two signals using at least one of a switch and filter, and said first and second signals differ by frequency.

* * * * *

UNITED STATES PATENT AND TRADEMARK OFFICE
CERTIFICATE OF CORRECTION

PATENT NO. : 9,689,912 B2  
APPLICATION NO. : 13/708019  
DATED : June 27, 2017  
INVENTOR(S) : Ming-Tien Tsai et al.

Page 1 of 1

It is certified that error appears in the above-identified patent and that said Letters Patent is hereby corrected as shown below:

In the Claims

Claim 11, Column 9, Line 67, insert -- said -- after "first".

Signed and Sealed this
Twenty-sixth Day of September, 2017

Joseph Matal
*Performing the Functions and Duties of the*
*Under Secretary of Commerce for Intellectual Property and*
*Director of the United States Patent and Trademark Office*